(12) United States Patent
Schuler et al.

(10) Patent No.: US 8,691,660 B2
(45) Date of Patent: Apr. 8, 2014

(54) SEMICONDUCTOR COMPONENT WITH TRENCH ISOLATION AND CORRESPONDING PRODUCTION METHOD

(75) Inventors: Franz Schuler, Dresden (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 123 days.

(21) Appl. No.: 12/883,023

(22) Filed: Sep. 15, 2010

(65) Prior Publication Data

US 2011/0003457 A1    Jan. 6, 2011

Related U.S. Application Data

(62) Division of application No. 10/523,239, filed as application No. PCT/DE03/02435 on Jul. 19, 2003, now Pat. No. 8,552,524.

(30) Foreign Application Priority Data

Jul. 22, 2002   (DE) .................................. 102 33 208

(51) Int. Cl.
*H01L 21/763*    (2006.01)
(52) U.S. Cl.
USPC .................................. 438/427; 257/E21.546
(58) Field of Classification Search
USPC .................. 438/424, 425, 427, 430, E21.546, 438/E21.572
See application file for complete search history.

(56) References Cited

U.S. PATENT DOCUMENTS

| 4,454,647 A | 6/1984 | Joy et al. ........................ 29/576 |
| 4,528,047 A | 7/1985 | Beyer et al. .................. 148/175 |
| 4,666,556 A | 5/1987 | Fulton et al. .................. 156/643 |

(Continued)

FOREIGN PATENT DOCUMENTS

| JP | 63-276263 | 11/1988 |
| JP | 63-289853 | 11/1988 |

(Continued)

OTHER PUBLICATIONS

Office Action (translation of Notification of Reasons for Refusal) from corresponding Japanese Patent Application No. 2010-094488.

(Continued)

*Primary Examiner* — Wael Fahmy
*Assistant Examiner* — Sarah Salerno (57) ABSTRACT

The invention relates to a semiconductor component with trench isolation and to an associated fabrication method, a trench isolation (STI, TTI) having a deep isolation trench with a covering insulation layer (10, 11), a side wall insulation layer (6) and an electrically conductive filling layer (7), which is electrically connected to a predetermined doping region (1) of the semiconductor substrate in a bottom region of the trench. The use of a trench contact (DTC), which has a deep contact trench with a side wall insulation layer (6) and an electrically conductive filling layer (7), which is likewise electrically connected to the predetermined doping region (1) of the semiconductor substrate in a bottom region of the contact trench, makes it possible to improve the electrical shielding properties with a reduced area requirement.

21 Claims, 12 Drawing Sheets

(56) References Cited

U.S. PATENT DOCUMENTS

| | | | | |
|---|---|---|---|---|
| 5,236,863 | A | * | 8/1993 | Iranmanesh ............... 438/429 |
| 5,675,173 | A | | 10/1997 | Kawai et al. ............... 257/508 |
| 6,214,696 | B1 | | 4/2001 | Wu ............................ 438/424 |
| 6,218,725 | B1 | | 4/2001 | Jeon ........................... 257/574 |
| 6,251,734 | B1 | * | 6/2001 | Grivna et al. ............... 438/296 |
| 6,277,709 | B1 | | 8/2001 | Wang et al. ................. 438/430 |
| 6,607,959 | B2 | | 8/2003 | Lee et al. .................... 438/296 |
| 6,720,638 | B2 | | 4/2004 | Tran ............................ 257/499 |
| 6,888,214 | B2 | | 5/2005 | Mouli et al. ................. 257/510 |
| 2001/0005022 | A1 | | 6/2001 | Ogura |
| 2002/0014676 | A1 | | 2/2002 | Marty et al. ................. 257/506 |
| 2002/0076879 | A1 | | 6/2002 | Lee et al. .................... 438/241 |
| 2002/0081809 | A1 | * | 6/2002 | Pinto et al. .................. 438/296 |
| 2003/0199136 | A1 | | 10/2003 | Kim et al. ................... 438/238 |

FOREIGN PATENT DOCUMENTS

| | | |
|---|---|---|
| JP | 02152252 A | 6/1990 |
| JP | 07048515 A | 2/1995 |
| JP | 2000-269317 | 9/2000 |
| JP | 2001-110890 | 4/2001 |
| JP | 2001185721 A | 7/2001 |
| JP | 2001291863 A | 10/2001 |

OTHER PUBLICATIONS

Office Action (translation of Notification of Reasons for Refusal) from corresponding Japanese Patent Application No. 2004-528395.
English language abstract of JP 2001-291863 A.
English language abstract of JP 07-048515 A.
English language abstract of JP 02-152252 A.

* cited by examiner

SEMICONDUCTOR COMPONENT WITH TRENCH ISOLATION AND CORRESPONDING PRODUCTION METHOD

RELATED APPLICATIONS

This application is a divisional application of U.S. patent application Ser. No. 10/523,239, filed Sep. 28, 2005, which is a national stage entry under 35 U.S.C 371 of PCT/DE03/02435, filed Jul. 19, 2003, which claims the benefit of priority to German Patent Application No. DE 10233208.8, filed Jul. 22, 2002.

BACKGROUND

1. Field of Application

The present invention relates to a semiconductor component with trench isolation and to an associated fabrication method, and, in particular, to a semiconductor component with a trench-type, bottom-contact-connected active shielding and to an associated fabrication method.

2. Background Information

Isolations for defining, in particular, active regions in semiconductor substrates have usually been formed by thick oxide films, so-called local oxidation regions (LOCOS, Local Oxidation of Silicon). As the integration density rises, however, such conventional LOCOS methods are no longer suitable since they have a high area requirement. What is more, they exhibit the so-called "birds beak" phenomenon, with insulation layers forming laterally in the direction of the active regions. Therefore, so-called trench isolations have been developed, in which case, for example in accordance with shallow trench isolation (STI), a shallow isolation trench filled with insulating material is formed at the surface of a semiconductor substrate. Nevertheless, such a conventional trench isolation is also often insufficient since so-called punch-through effects occur in the semiconductor material. Undesirable leakage currents are observed in this case. In the extreme case, parasitic bipolar transistors may be triggered by these leakage currents and semiconductor components may therefore be destroyed.

Trench isolations with a shielding structure have recently been developed in particular for the purpose of reducing such leakage currents, in which case, in order to realize a field shielding in the trench, an electrically conductive material is embedded as electrode and leads to improved electrical properties. Such trench isolations with shielding action are usually contact-connected at the substrate surface or from the substrate.

What are disadvantageous in this case, however, are an inadequate shielding action and/or an increased area requirement on account of the necessary contact connection.

SUMMARY

Therefore, the invention is based on the object of providing a semiconductor component with trench isolation and an associated fabrication method, it being possible to realize not only an improved 15 shielding but also a reduced area requirement and thus an improved integration density.

According to the invention, this object is achieved by means of the features of patent claim 1 with regard to the semiconductor component and by means of the measures of patent claim 7 with regard to the fabrication method.

In particular through the use of a special trench contact, which has a deep contact trench with a side wall insulation layer and an electrically conductive filling layer, which is electrically connected to a predetermined doping region of the semiconductor substrate in a bottom region of the contact trench, and via which a trench isolation with active shielding is contact-connected, substrate resistances, in particular, can be significantly reduced, as a result of which improved shielding properties are obtained. At the same time, the use of the trench contact makes it possible to significantly reduce an area requirement for a respective semiconductor circuit.

Preferably, a covering insulation layer of the trench isolation is situated below the semiconductor substrate surface and within the isolation trench, which results in particular in an improved further processability on account of the relatively even surface and an insulation of the conductive trench filling from conductive layers, such as e.g. interconnects, possibly lying above the covering insulation layer.

Preferably, the trench isolation and the trench contact are formed with a depth in the semiconductor substrate which is larger than a depth of a respective depletion zone, as a result of which punch-through effects, in particular, can be reduced.

If widened or so-called shallow isolation trenches are used at the semiconductor substrate surface of the respective trench isolation, then unrequired or non-active regions of a semiconductor substrate can be passivated in a simple manner using conventional standard methods.

Preferably, the semiconductor substrate has a multiple well structure, the predetermined doping region constituting a doping well situated therein, as a result of which optimally adapted shieldings can be realized even in the case of complex semiconductor circuits. In particular, a contact connection of well regions is significantly improved in this case since a contact connection that has been made uniform is made possible and potential fluctuations within a well are reduced. On the other hand, it is possible to significantly reduce an area requirement since respective well contacts now no longer have to be routed to a semiconductor substrate surface.

Further advantageous refinements of the invention are characterized in the further subclaims.

BRIEF DESCRIPTION OF THE DRAWINGS

The invention is described in more detail below using exemplary embodiments with reference to the drawing.

In the figures.

DETAILED DESCRIPTION

First Exemplary Embodiment

Figure 1A:
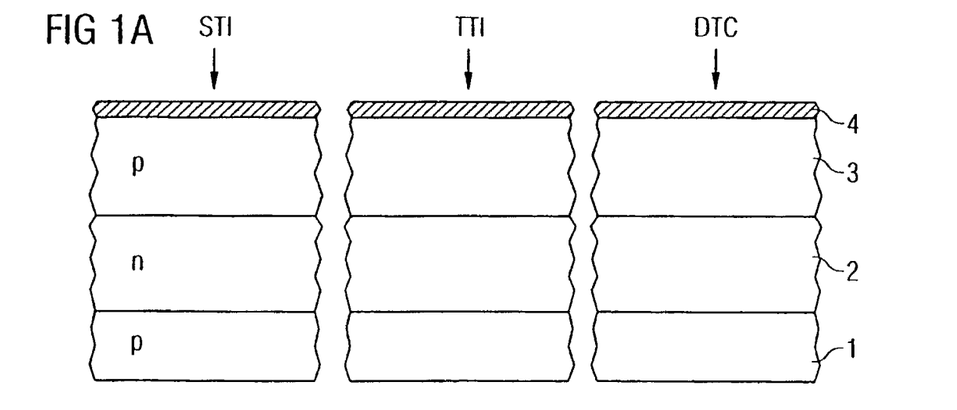
FIGS. 1A to 1N show simplified sectional views for 5 illustrating essential method steps in the fabrication of a semiconductor component with trench isolation in accordance with a first exemplary embodiment.
Figure 1B:
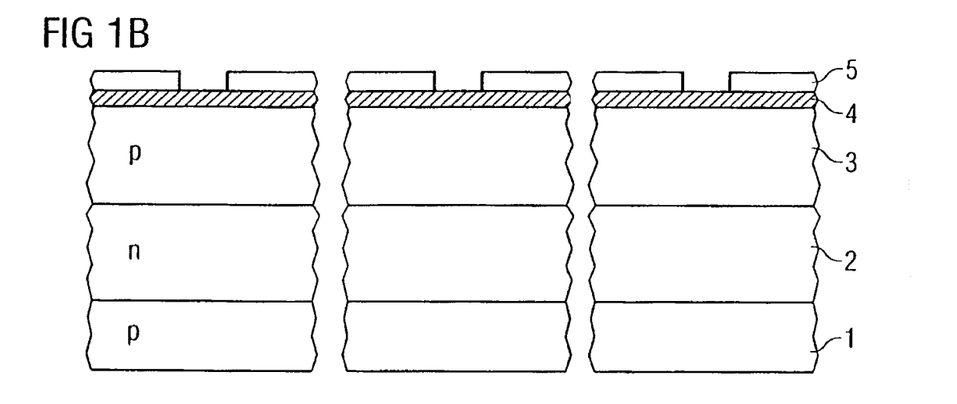
Figure 1C:
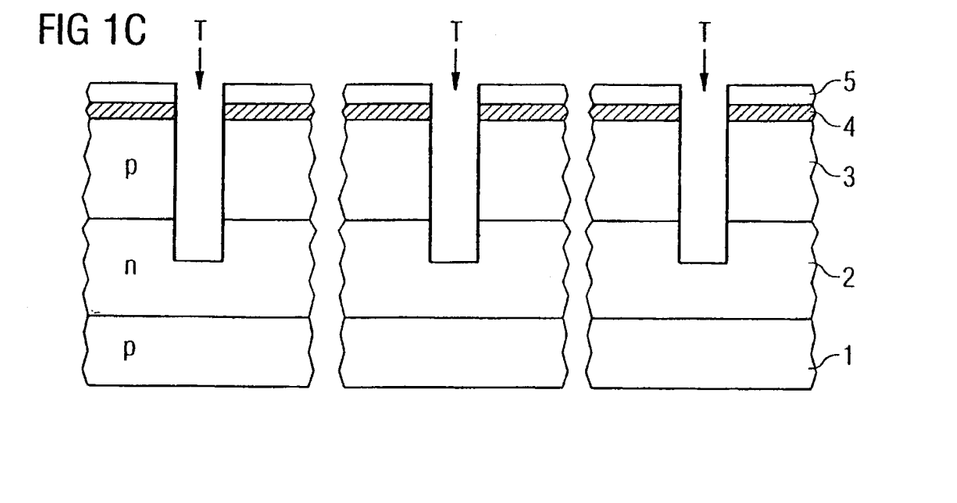
Figure 1D:
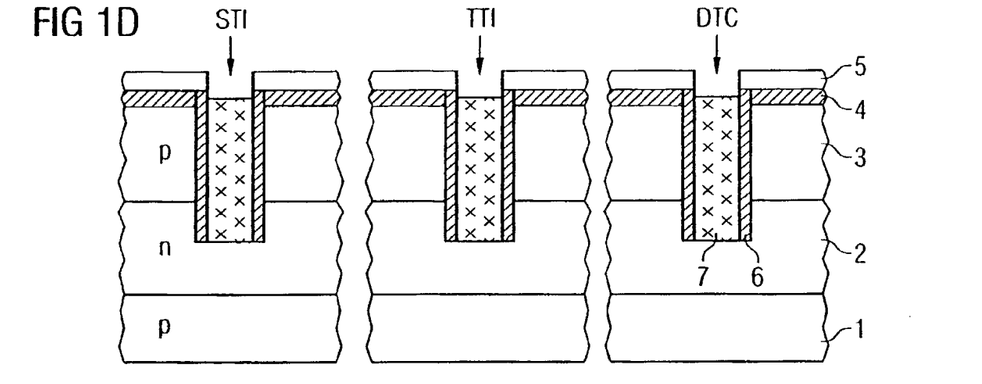
Figure 1E:
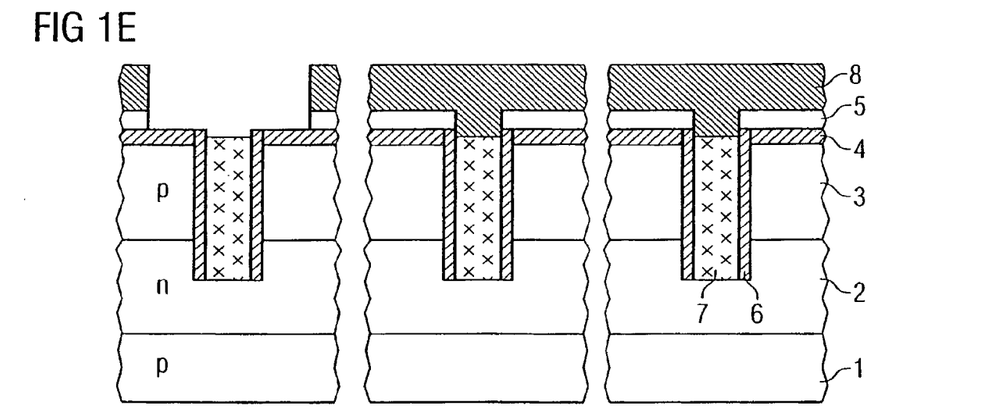
Figure 1F:
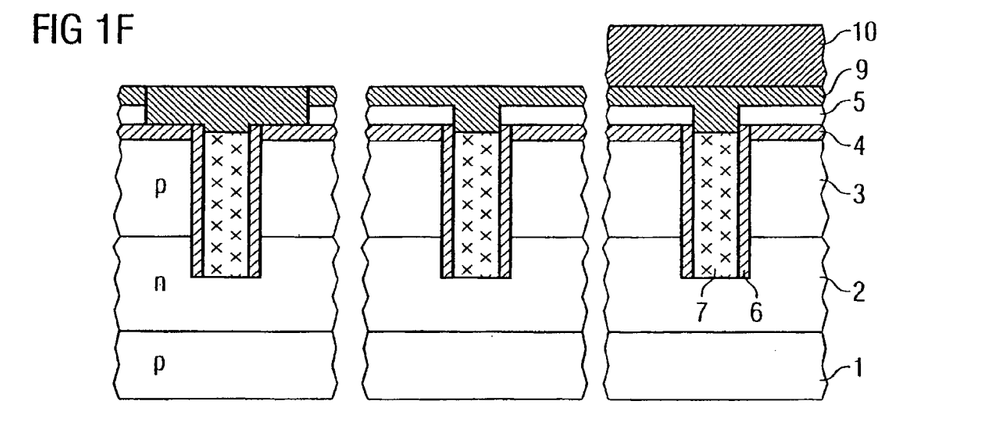
Figure 1G:
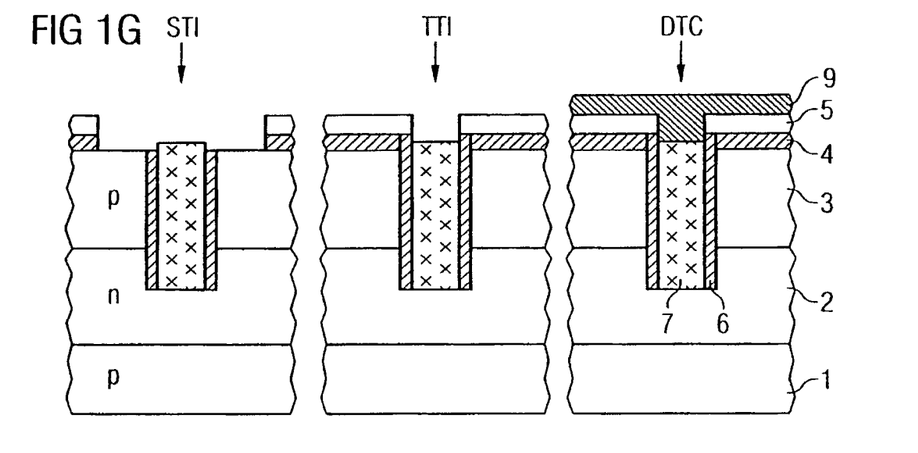
Figure 1H:
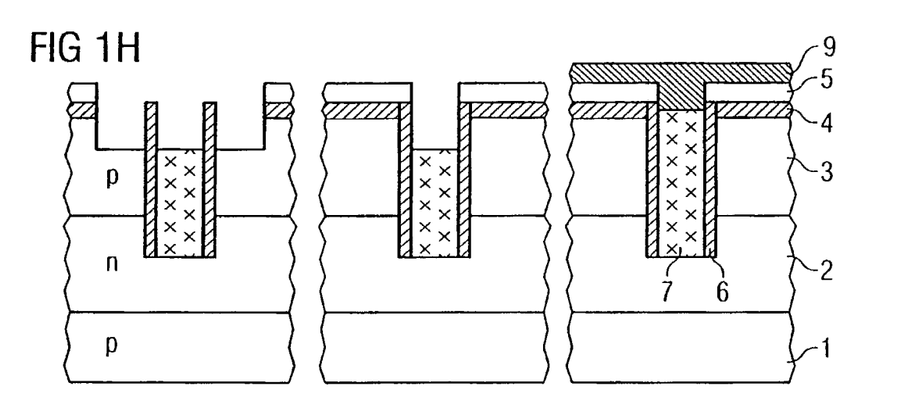
Figure 1I:
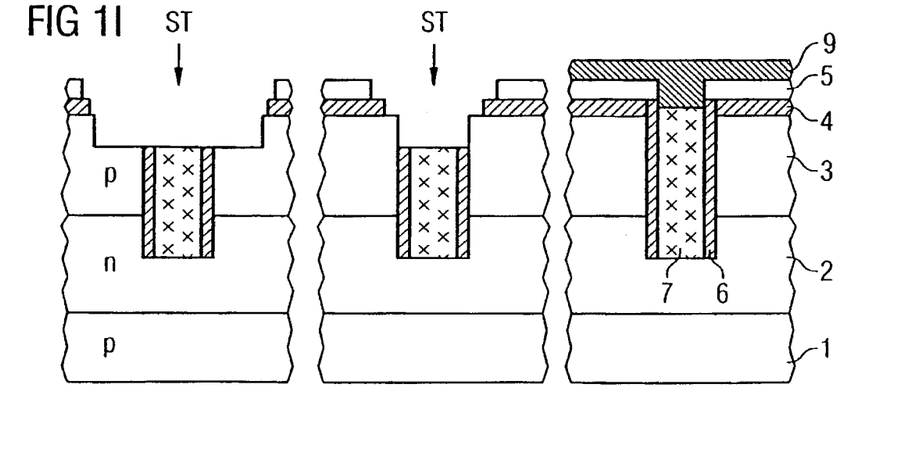
Figure 1J:
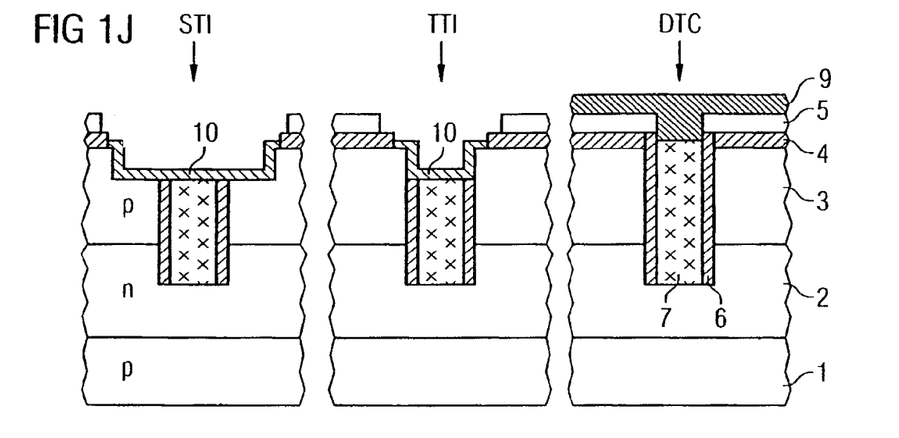
Figure 1K:
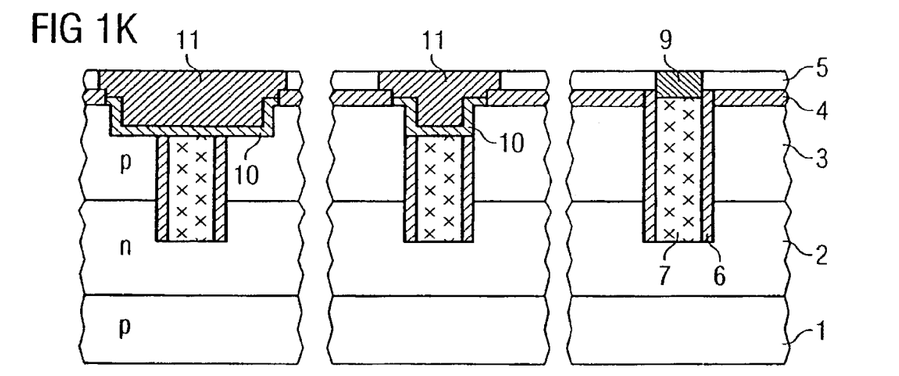
Figure 1L:
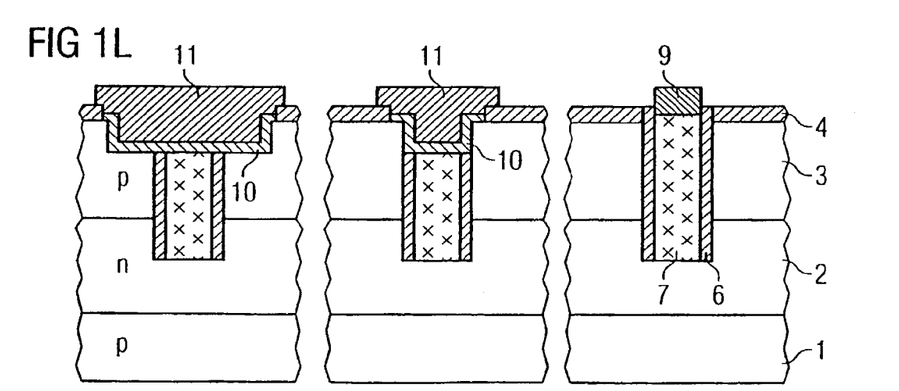
Figure 1M:
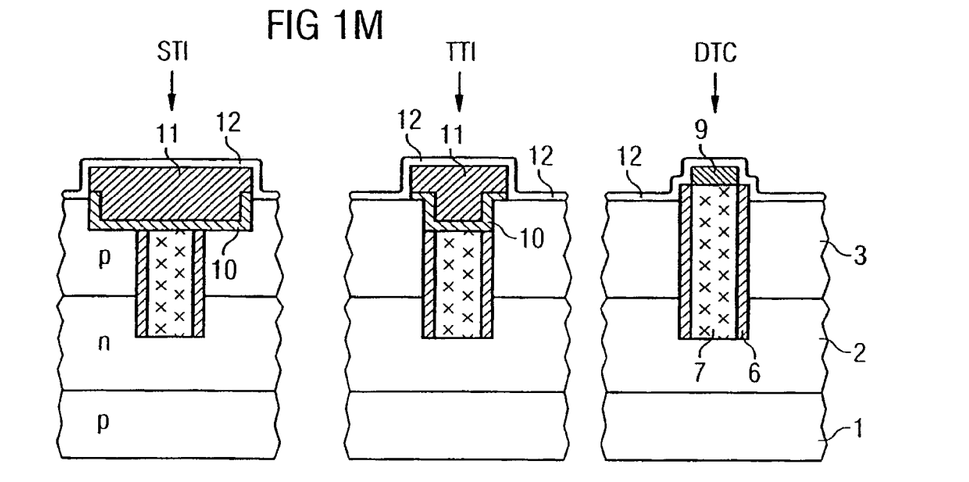
Figure 1N:
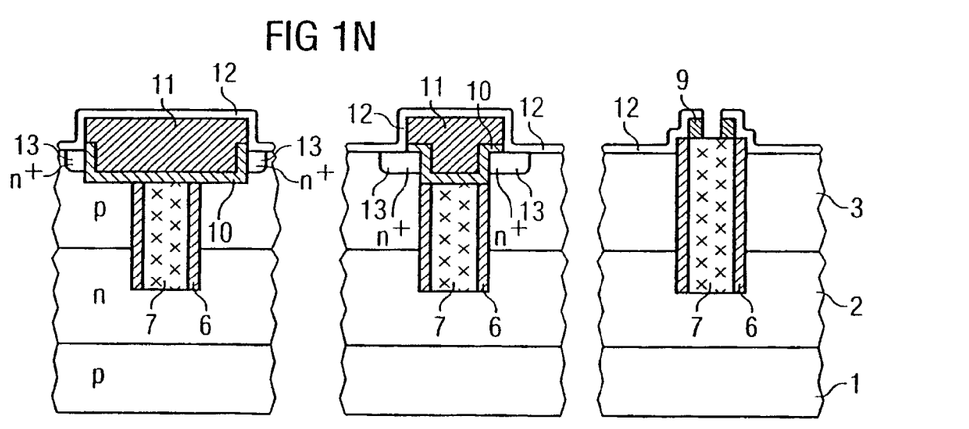

FIGS. 1A to 1N show simplified sectional views of a semiconductor component with a—in an upper region—widened but shallow trench isolation STI, a—in its upper region—thin trench isolation TTI and an associated trench contact DTC (Deep Trench Contact) in accordance with a first exemplary embodiment.

In accordance with FIG. 1A, firstly different doping regions are formed in a common carrier material such as e.g. a semiconductor substrate, the reference symbol 1 for example representing a p-type semiconductor substrate or a deep p-type well, the reference symbol 2 an n-type well and the reference symbol 3 a (shallow) p-type well. The wells or doping regions 1, 2 and 3 may be formed for example by means of ion implantation or other doping methods, silicon preferably being used as semiconductor material.

By way of example, a first insulation layer 4 in the form of an oxide layer is deposited or grown at the surface of the semiconductor substrate. A double or triple well structure is obtained in this way in the semiconductor substrate and can be used to realize complex semiconductor circuits and, in particular, NMOS and PMOS transistors. In order to realize high-voltage circuits, the wells may be formed with corresponding high-voltage dopings.

In accordance with FIG. 1B, a hard mask layer 5 is subsequently formed at the surface of the first insulation layer 4 for example by means of a deposition method, e.g. $Si_3N_4$ being deposited. A patterning by means of conventional lithographic methods is subsequently effected in order to form a corresponding hard mask for deep trenches T that are to be formed later.

In accordance with FIG. 1C, deep trenches T are formed using the patterned hard mask or hard mask layer 5 by means of e.g. an anisotropic etching method in respective regions for a trench isolation with shallow but widened surface region STI, a thin trench isolation TTI and a trench contact DTC. By way of example, the anisotropic etching method used may be a reactive ion etch (RIE), as a result of which very deep and exactly patternable trenches with the same depth are formed in the semiconductor substrate.

In particular when using a trench structure, the deep trenches being situated only within a well or an identically doped substrate, in order to avoid so-called punch-through effects, the depth of the trenches is larger than a depth of an associated depletion zone of doping regions that are formed or are to be formed later at the surface.

In accordance with FIG. 1C, the deep trenches T extend right into a predetermined doping region or a predetermined doping well 2, which, by way of example, constitutes a middle N-type well of a triple well structure.

In accordance with FIG. 1D, the formation of the deep trenches T is then followed by the formation of a side wall insulation layer 6 at the side walls of the trenches T, in which case firstly, after cleaning for the removal of the dry etching polymers, a trench insulation layer is formed at the surface of the trench T. This trench insulation layer is preferably formed as a so-called liner oxide by means of a thermal oxidation method, an anisotropic reactive ion etch, for example, being carried out in order to remove a bottom region of the trench insulation layer. After the removal of the bottom region of the trench insulation layer, thereby completing the side wall insulation layer 6, the trench is filled with an electrically conductive material 7, a highly doped polysilicon, for example, being deposited whose doping has the same conduction type n as the predetermined doping region or the n-type well 2. Finally, the electrically conductive filling layer 7 is subjected to an anisotropic etching-back step, for example, as a result of which the sectional view illustrated in FIG. 1D is obtained.

In accordance with FIG. 1E afterward a resist layer 8 is formed at the surface of the semiconductor substrate and of the filled trenches and is correspondingly patterned in order to realize a widened surface trench STI at least in this region and the structure is transferred to the underlying hard mask layer 5. In this way, a conventional shallow trench isolation can be formed in semiconductor regions to be passivated, as a result of which even large area regions can be deactivated in a simple manner.

In accordance with FIG. 1F afterward the first resist layer 8 is removed or stripped and a second insulation layer 9 is formed over the whole area, preferably a silicon dioxide hard mask layer (e.g. TEOS) being deposited by means a CVD method (Chemical Vapor Deposition). Afterward, a second resist layer 10 is formed over the whole area and patterned by means of conventional photolithographic methods in such a way that only the trench isolations STI and TTI are uncovered and the region for the trench contact DTC continues to be protected.

In accordance with FIG. 1G, the deposited second insulation layer 9 is then removed in the regions for the trench isolations STI and TTI, in which case conventional etching methods can be used, and the second resist layer 10 is then removed or stripped, as a result of which the sectional view illustrated in FIG. 1G is obtained.

In accordance with FIG. 1H, a further etching method is then effected using the hard mask layer 5 in the regions of the trench isolations STI and TTI and the second insulating layer 9 in the region of the trench contact DTC, both the semiconductor material or silicon of the topmost p-type well 3 and an upper region of the electrically conductive filling layer 7 or of the highly doped polysilicon being removed preferably by means of an anisotropic etching method. This is preferably done by means of a reactive ion etch. A cleaning process is then effected, in which the polymers arising during the previous dry etching method are also removed, inter alia.

Since the side wall insulation layer 6 remains in particular in the widened trench isolation STI with shallow and widened surface region, by way of example, an HF dip for removing the residual side wall insulation layer 6 is carried out in a subsequent step in accordance with FIG. 1I. In this way, in the regions of the trench isolation STI and TTI, the side wall insulation layers 6 are removed in an upper region of the deep trench T, as a result of which shallow and partly widened trenches ST are obtained. Furthermore, in accordance with FIG. 1I, the edges of the hard mask layer 5 can also be etched back in the uncovered regions of the trench isolations STI and TTI, which is referred to as so-called "Nitride Pullback". This results in a certain stress relief of the trench edges for the further processing and also improved electrical properties of CMOS transistors that are likewise present, for example.

In accordance with FIG. 1J, a first covering 35 insulation partial layer 10 is subsequently formed in the shallow trenches ST of the trench isolation regions STI and TTI that have been formed, which partial layer preferably forms a so-called liner oxide as insulation layer conformally once again . . . by means of a thermal oxidation. In. the same way, however, it is also possible to carry out alternative methods for forming this insulation layer (such as e.g. layer structures).

In accordance with FIG. 1K, a second covering insulation partial layer 11 is subsequently formed in the shallow trench ST or at the surface of the first covering insulation partial layer 10, a CVD deposition of SiO$_2$ (e.g. TEOS) preferably being carried out. The shallow trenches ST are completely filled in this way. In order to planarize the second covering insulation partial layer 11 deposited in this way, by way of example, a conventional CMP method (chemical mechanical polishing) is carried out, the hard mask layer 5 being used as a stop layer. Accordingly, during this step, the second insulation layer 9 is also removed in the region of the trench contacts DTC, as a result of which the sectional view illustrated in FIG. 1K is obtained.

In accordance with FIG. 1L, the hard mask layer 5 or the silicon nitride layer is then removed over the whole area, as a result of which only the first insulation layer 4, the second insulation layer 9 and 25 the second covering insulation partial layer 11 remain on the semiconductor substrate. A particularly simplified method step is obtained in this case in particular with the use of silicon dioxide for these layers.

In a subsequent method step, in accordance with FIG. 1M, the residual first insulation layer 4, also referred to as a silicon dioxide buffer layer, is removed, in which case the second insulator layer 9 and the second covering insulation partial layer 11 are also correspondingly removed and should have corresponding thicknesses in order to avoid short circuits or unintentional topographies.

Afterwards, a gate oxide layer is formed as gate dielectric 12, for example by means of thermal oxidation, it being possible for this gate dielectric 12 also to be formed by means of alternative methods and alternative materials. The actual formation of switching elements in the active regions of the semiconductor substrate or the p-type well 3 is then usually effected, FIG. 1N merely indicating n+-doped doping regions 13. In the region of the trench contact DTC, from this point in time, a contact opening for making contact with the deep n-type well 2 via the electrically conductive filling layer 7 is also uncovered by means of conventional methods. The further fabrication methods for forming NMOS or PMOS transistors are not illustrated in this case since they correspond to conventional fabrication steps.

A semiconductor component with trench isolation that is contact-connected at the bottom side is obtained in this way, said trench isolation having an improved shielding action since, in particular, contact resistances in the predetermined doping regions or the n-type well 2 can be kept minimal and, moreover, an area requirement for contact connection from above can be obviated. More precisely, an optimum connection possibility can be found through suitable positioning of the trench contact DTC in the predetermined doping region 2 with respect to each trench isolation situated therein. On account of the covering insulation layers 10 and 11 sunk in the trenches, it is possible, moreover, to prevent undesirable topographies, as a result of which a further-reaching processing can be simplified. Furthermore, by means of the method steps illustrated in FIGS. 1A to 1N, both very narrow 35 trench isolations TTI and thus high integration densities and widened trench isolations STI at the surface can be formed and connected effectively as active shieldings in the semiconductor substrate, as a result of which not only is it possible to realize a very small area requirement for active components but also active regions that are not desired or required can be deactivated without difficulty by means of the widened trench isolations STI.

In the case of the multiple well structure illustrated in FIG. 1N, in particular, it is possible, accordingly, to realize even very complex semiconductor circuits with an extraordinarily high integration density since punch-through effects and leakage currents are reliably prevented.

Second Exemplary Embodiment

Figure 2:
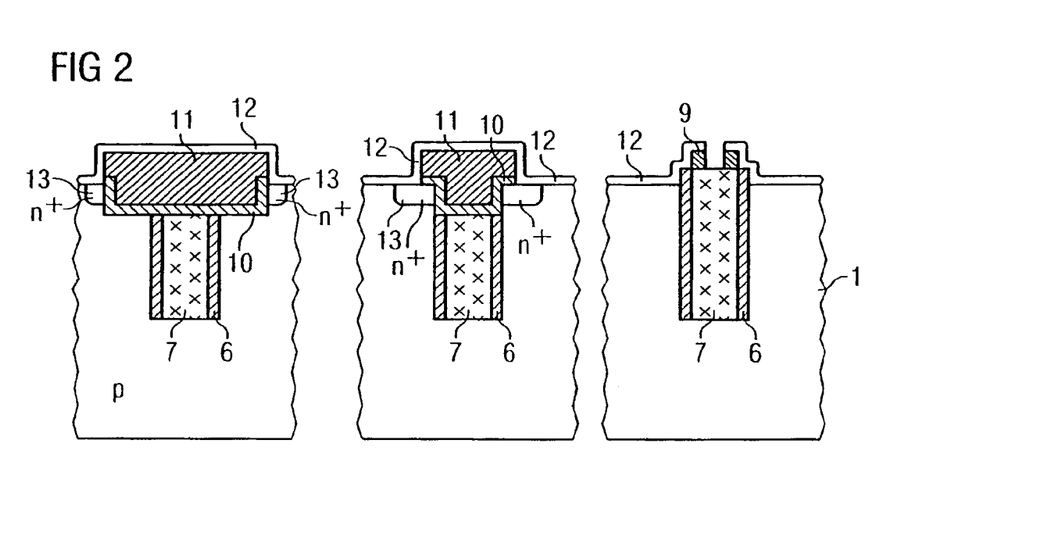
FIG. 2 shows a simplified sectional view for illustrating a semiconductor component with trench isolation in accordance with a second exemplary embodiment.

FIG. 2 shows a simplified sectional view of a semiconductor component with trench isolation in accordance with a second exemplary embodiment, identical reference symbols designating elements or layers identical or corresponding to those in FIG. 1, for which reason a repeated description is dispensed with below.

In accordance with FIG. 2, however, the semiconductor component may not only be formed in a semiconductor substrate with a multiple well structure, but rather may have merely a single doping, as a result of which, in particular for greatly simplified semiconductor circuits, improved shielding properties are likewise obtained with a reduced area requirement. The semiconductor component illustrated in FIG. 2 is an NMOS transistor, for example, a p-type semiconductor substrate 1 being used and, consequently, a p$^+$-doped semiconductor material being used as electrically conductive filling layer. An improved connection possibility for the trench isolations that are contact-connected at the bottom side is once again obtained on account of the trench contacts DTC used, thus resulting in an improved shielding with a reduced area requirement. In the case of such simple semiconductor substrates, in particular, a depth of the trenches should be larger than a depth of the depletion zones produced by the doping regions 13, in order to effectively prevent a so-called punch-through effect.

Furthermore, it should be pointed out that, particularly when using highly doped polycrystalline semiconductor materials as electrically conductive filling layer 7, an outdiffusion takes place at the foot of the contact during the subsequent process steps (not illustrated), as a result of which further improved insulating properties can be produced.

Third Exemplary Embodiment

Figure 3:
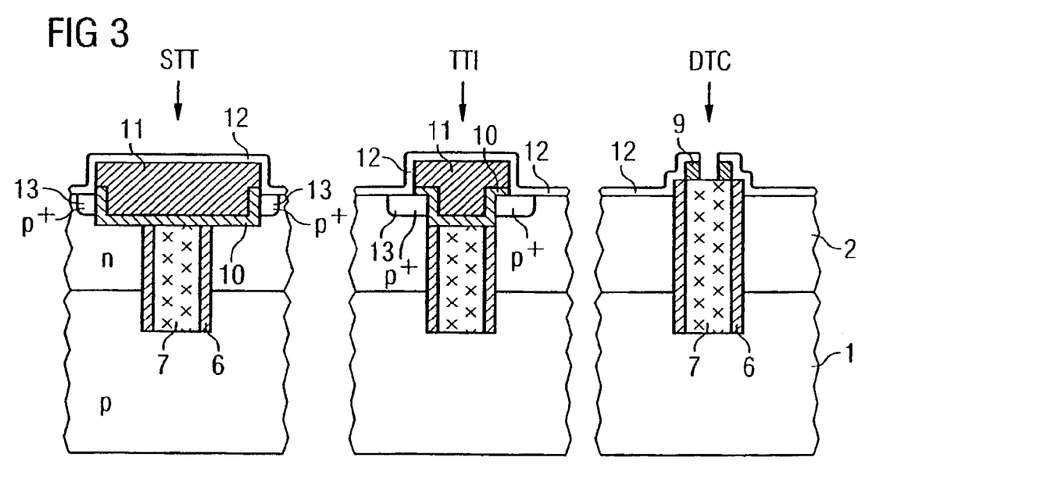
FIG. 3 shows a simplified sectional view for illustrating a semiconductor component with trench isolation in accordance with a third exemplary embodiment.

FIG. 3 shows a simplified sectional view of a semiconductor component with trench isolation in accordance with a third exemplary embodiment, identical reference symbols designating elements or layers identical to those in FIG. 1 or 2 and a repeated description being dispensed with below.

In accordance with FIG. 3, the semiconductor substrate now has only a p-type well or an actual substrate 1 and an additional n-type well 2, the electrically conductive filling layer 7 being connected to the p-type well or the substrate 1. This yields an STI and TTI trench isolation for PMOS transistors, for which reason the doping regions 13 are p$^+$-doped. Particularly when using highly doped semiconductor material, the electrically conductive filling layer is accordingly composed of a p'-doped polysilicon.

Improved shielding properties with a reduced area requirement again result in accordance with the first and secondary exemplary embodiment.

Fourth Exemplary Embodiment

Figure 4:
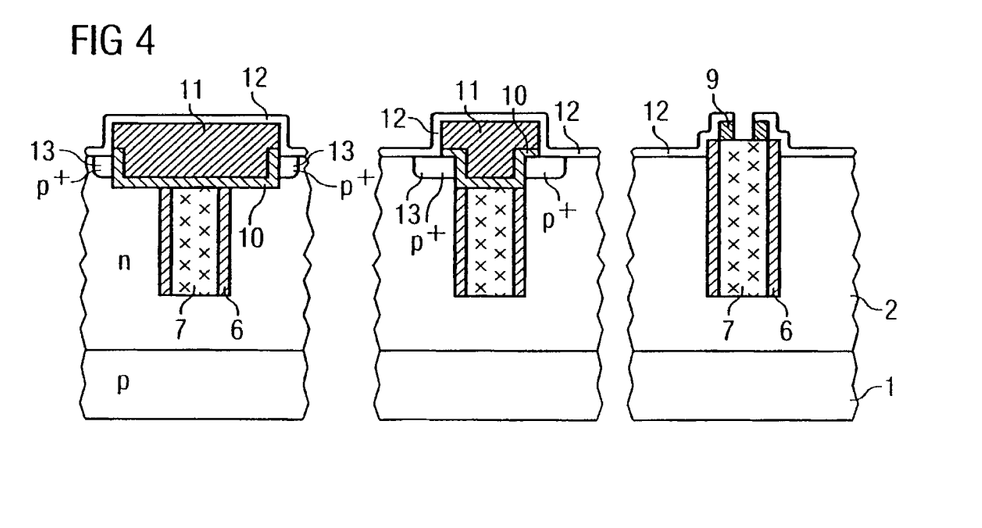
FIG. 4 shows a simplified sectional view for illustrating a semiconductor component with trench isolation in accordance with a fourth exemplary embodiment.

FIG. 4 shows a simplified sectional view of a semiconductor component with trench isolation in accordance with a fourth exemplary embodiment, identical reference symbols again designating elements or layers identical to those in FIGS. 1 and 3 and a repeated description being dispensed with below.

An STI and TTI trench isolation with associated trench contact DTC for PMOS transistors is again known in accordance with FIG. 4, a double well structure or an n-type well 2 in a p-type substrate 1 now being formed again. In accordance with FIG. 4, the bottom-side connection of the trench isolation may accordingly also be situated in the first n-type well 2, in which case once again preferably n+-doped polysilicon is used and, in order to avoid punch-through effects, a corresponding depth of the trenches is larger than a depth of the space charge zones.

Once again improved shielding properties with a reduced area requirement for semiconductor components with trench isolations can be produced in this case, too, it being possible to fabricate simultaneously both narrow trench isolations TTI and trench isolations with a widened trench surface STI.

Fifth Exemplary Embodiment

FIGS. 5A to 5H show simplified sectional views for illustrating essential method steps in the fabrication of a semiconductor component with trench isolation in accordance with a fifth exemplary embodiment, identical reference symbols designating layers or—elements identical or corresponding to those in FIGS. 1 to 4 and a repeated description being dispensed with below.

In accordance with the fifth exemplary embodiment, now only a widened trench isolation STI with a widened surface structure and an associated trench contact DTC are formed, as a result of which the method steps can be slightly simplified.

Firstly, however, the same method steps as in FIGS. 1A to 1D are again effected, as a result of which a side wall insulation layer 6 and an electrically conductive filling layer 7 are formed in deep trenches T.

Figure 5A:
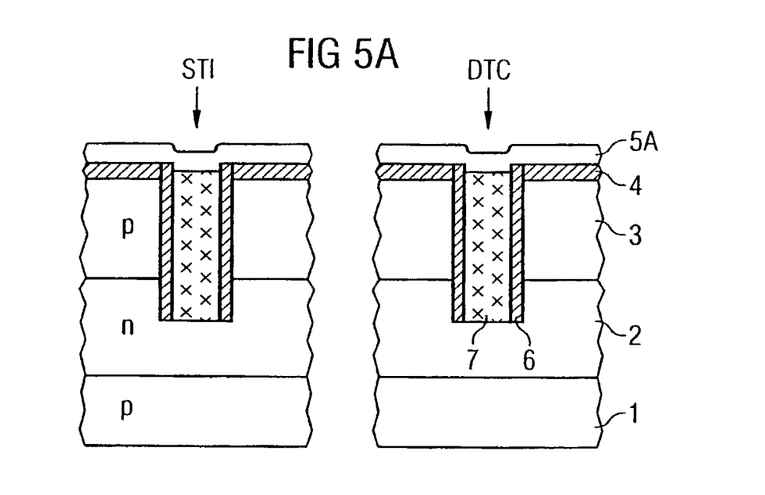
FIGS. 5A to 5H show simplified sectional views for illustrating essential method steps in the fabrication of a semiconductor component with trench isolation in accordance with a fifth exemplary embodiment.

In a method step in accordance with FIG. 5A, which follows the method step in accordance with FIG. 1D, the hard mask layer 5, preferably comprising a silicon nitride layer, is then completely removed and a new second hard mask layer 5A is deposited over the whole area, by way of example.

Figures 5B, 5C:
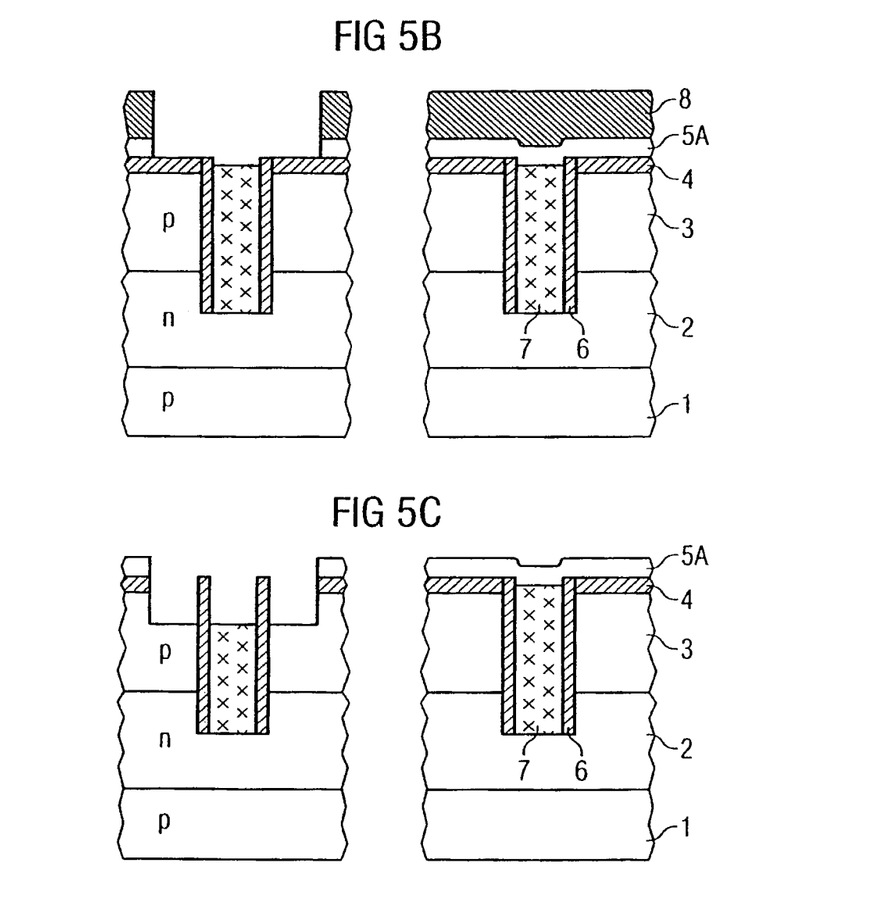

In accordance with FIG. 5B, in a subsequent method step, once again a first resist layer 8 for patterning the region for the widened trench isolation STI is applied and patterned by means of conventional photolithographic methods. Using this resist mask, the second hard mask layer 5A is subsequently removed in particular in the region of the widened trench isolation STI, as a result of which the sectional view illustrated in FIG. 5B is obtained.

In accordance with FIG. 5C, afterward the first resist layer 8 is removed or a resist stripping is effected and the electrically conductive filling layer 7 and the semiconductor substrate or the p-type well 3 are removed in an upper region of the trenches. This step essentially corresponds to the method step in accordance with FIG. 1H of the first exemplary embodiment, firstly the first insulating layer or silicon dioxide buffer layer 4 and then the semiconductor material being removed. This step is once again concluded by a cleaning process or by the removal of the residual polymers.

Figure 5D:
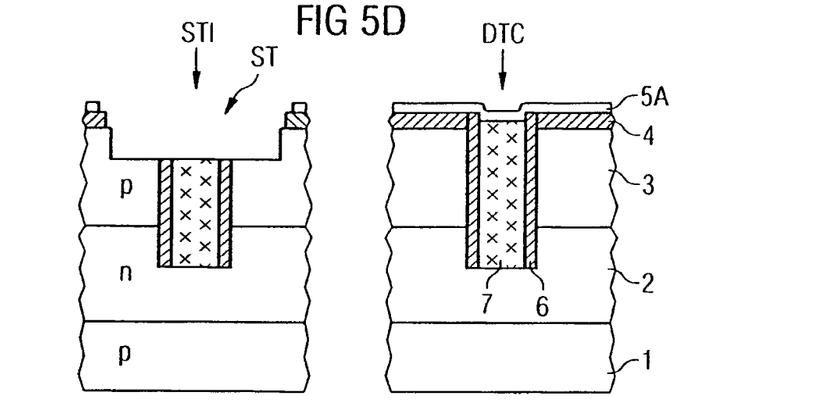
Figure 5E:
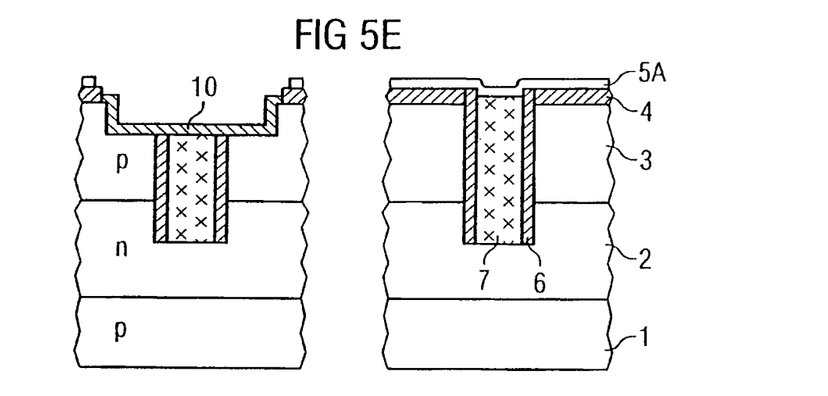

In accordance with FIG. 5D, in the same way as in the step in accordance with FIG. 1I, a brief dipping into hydrofluoric acid (HF dip) is carried out, as a result of which the residual silicon dioxide side wall insulation layers 6 are removed. Furthermore, for the stress relief of the trench edges, an etching-back of the second hard mask layer 5A is carried out, which is referred to as so-called nitride fallback and leads to an etching-back or thickness reduction of this layer in the region of the trench contacts DTC as well.

Figure 5F:
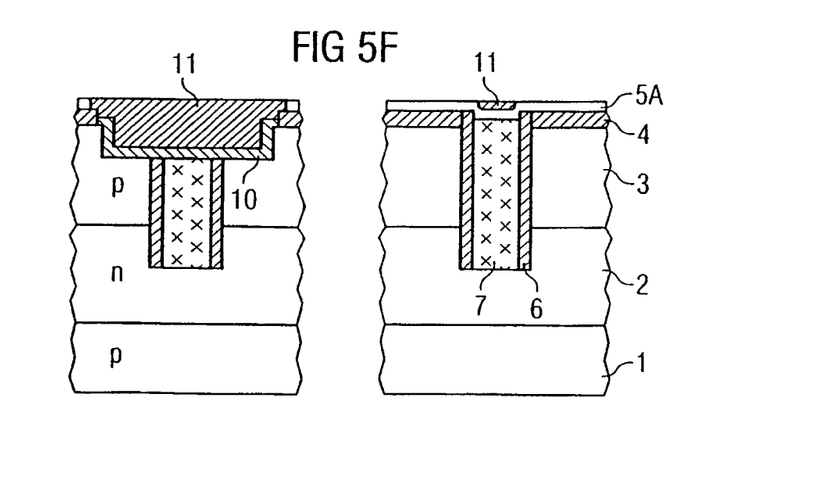

In accordance with FIG. 5E, once again the first covering insulation partial layer 10 is then formed, and the second covering insulation partial layer 11 is formed in FIG. 5F, the same method steps as in FIGS. 1J and 1K once again being carried out.

In accordance with FIG. 5F, however, in particular in the region of the trench contact DTC, in a trough in the second hard mask layer 5A, a second covering insulation partial layer 11 in the form of a TEOS silicon dioxide layer is likewise deposited by means of a CVD method.

Figure 5G:
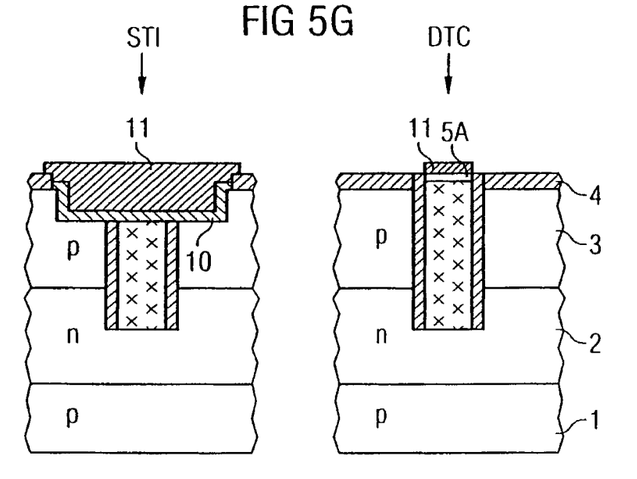
Figure 5H:
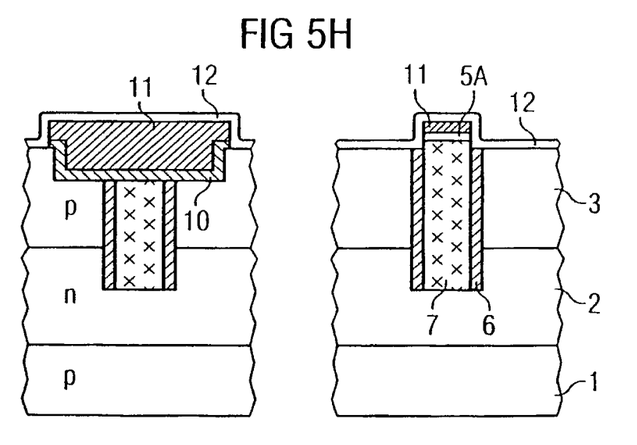
Figure 6A:
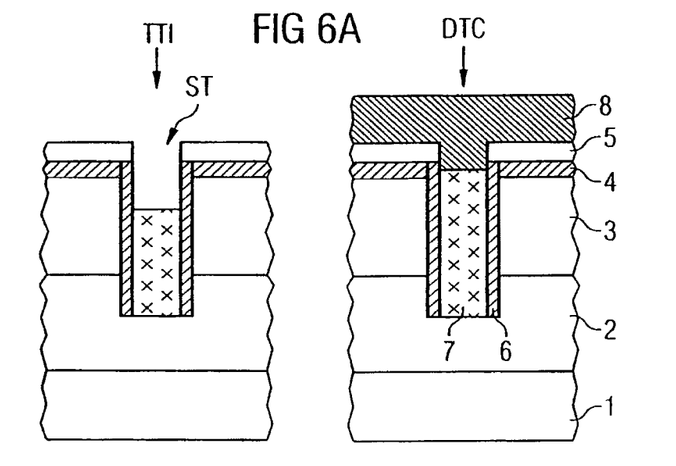
FIGS. 6A to 6E show simplified sectional views for illustrating essential method steps in the fabrication of a semiconductor component with trench isolation in accordance with a sixth exemplary embodiment.
Figure 6B:
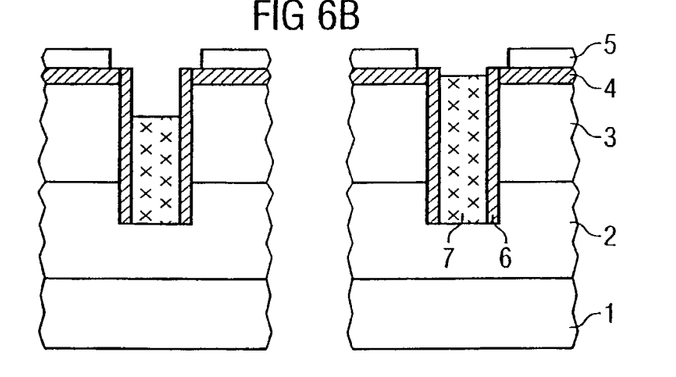
Figure 6C:
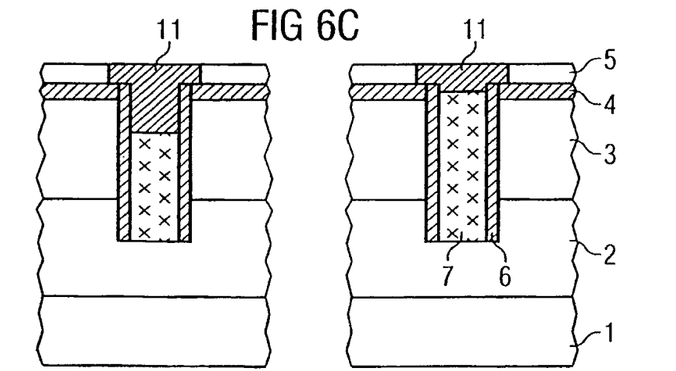
Figure 6D:
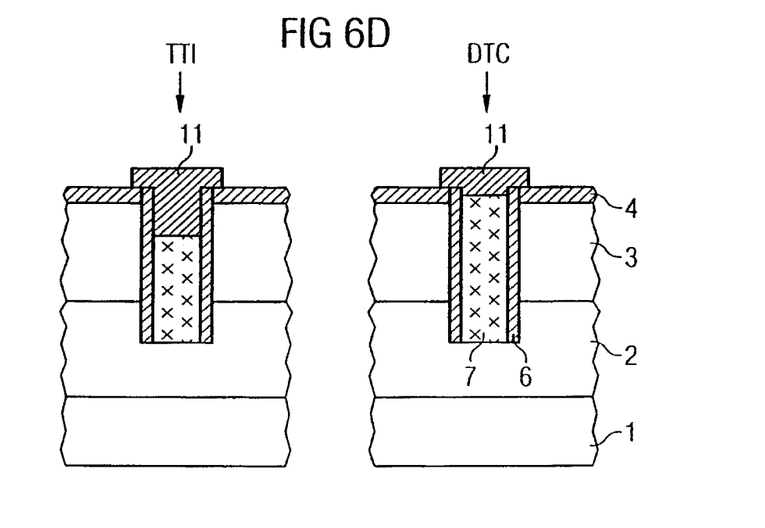
Figure 6E:
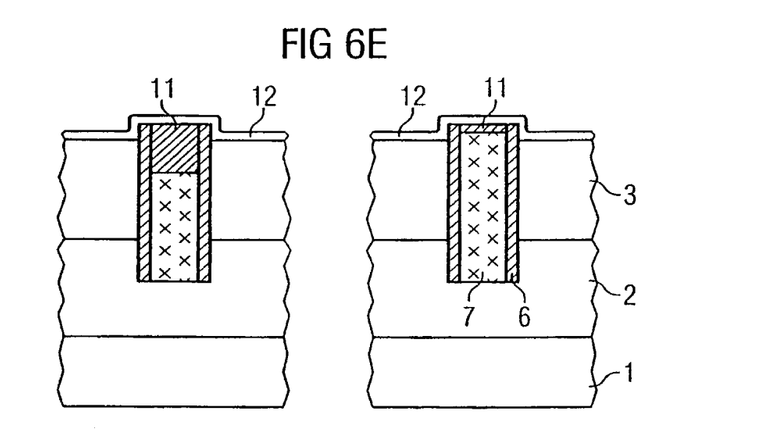

In accordance with FIG. 5G, the uncovered regions of the second hard mask layer 5A are then also completely removed, but a part of said layer 5A remains below the second covering insulation partial layer 11 in the region of the trench contact DTC.

Finally, in accordance with FIG. 5H, once again the first insulation layer 4 or the silicon dioxide buffer layer is completely removed and a gate dielectric 12 is formed over the whole area, a thermal oxidation preferably being carried out in order to form a conformal (uniformly thick) gate oxide.

We claim:

1. A method for fabricating a semiconductor component with trench isolation, the method comprising:
    preparing a semiconductor substrate with at least one predetermined doping region;
    forming deep trenches as far as the predetermined doping region for the purpose of realizing at least one trench isolation and a trench contact;
    forming a side wall insulation layer at the side walls of the trenches;
    forming an electrically conductive filling layer having the same conduction type as the predetermined doping region in the trenches, the electrically conductive filling layer being electrically connected to the at least one predetermined doping region of the semiconductor substrate;
    removing at least the electrically conductive filling layer and side wall insulation layer in the upper region of the trenches for the trench isolation for the purpose of forming shallow trench isolations; and
    forming a covering insulation layer in the shallow trench isolations of the trench isolation.

2. The method according to claim 1, wherein preparing a semiconductor substrate with at least one predetermined doping region comprises forming a double or triple well structure in the semiconductor substrate.

3. The method according to claim 2, wherein forming deep trenches as far as the predetermined doping region for the purpose of realizing at least one trench isolation and a trench contact comprises forming the deep trenches using a first hard mask layer by means of an anisotropic etching method in the semiconductor substrate.

4. The method according to claim 3, wherein forming a side wall insulation layer at the side walls of the trenches comprises carrying out a thermal oxidation in order to form a trench insulation layer and carrying out an anisotropic etching method in order to remove a bottom region of the trench insulation layer.

5. The method according to claim 3, wherein forming an electrically conductive filing layer in the trenches, the electrically conductive filling layer being electrically connected to the at least one predetermined doping region of the semiconductor substrate, comprises depositing a highly doped semiconductor material having the same conduction type as the predetermined doping region.

6. The method according to claim 3, wherein removing at least the electrically conductive filling layer and side wall insulation layer in the upper region of the trenches for the trench isolation for the purpose of forming shallow trench isolations, comprises removing the conductive filling layer, the side wall insulation layer and adjoining regions of the semiconductor substrate in the upper region of the deep trenches in order to realize a widened trench isolation.

7. The method according to claim 3, wherein removing at least the electrically conductive filling layer and side wall insulation layer in the upper region of the trenches for the trench isolation for the purpose of forming shallow trench isolations, comprises removing only the conductive filling layer with or without the side wall insulation layer in the upper region of the trenches in order to realize a narrow trench isolation.

8. The method according to claim 2, wherein forming a covering insulation layer in the shallow trench isolations of the trench isolation comprises carrying out an oxidation in order to form a first covering insulation partial layer and/or carrying out a deposition in order to form a second covering insulation partial layer in the shallow trench isolation.

9. The method according to claim 2, wherein forming a side wall insulation layer at the side walls of the trenches comprises carrying out a thermal oxidation in order to form a trench insulation layer and carrying out an anisotropic etching method in order to remove a bottom region of the trench insulation layer.

10. The method according to claim 2, wherein forming an electrically conductive filling layer in the trenches, the electrically conductive filling layer being electrically connected to the at least one predetermined doping region of the semiconductor substrate, comprises depositing a highly doped semiconductor material having the same conduction type as the predetermined doping region.

11. The method according to claim 2, wherein removing at least the electrically conductive filling layer and side wall insulation layer in the upper region of the trenches for the trench isolation for the purpose of forming shallow trench isolations, comprises removing the conductive filling layer, the side wall insulation layer and adjoining regions of the semiconductor substrate in the upper region of the deep trenches in order to realize a widened trench isolation.

12. The method according to claim 2, wherein removing at least the electrically conductive filling layer and side wall insulation layer in the upper region of the trenches for the trench isolation for the purpose of forming shallow trench isolations, comprises removing only the conductive filling layer with or without the side wall insulation layer in the upper region of the trenches in order to realize a narrow trench isolation.

13. The method according to claim 2, wherein forming a covering insulation layer in the shallow trench isolations of the trench isolation comprises carrying out an oxidation in order to form a first covering insulation partial layer and/or carrying out a deposition in order to form a second covering insulation partial layer in the shallow trench isolation.

14. The method according to claim 1, wherein forming deep trenches as far as the predetermined doping region for the purpose of realizing at least one trench isolation and a trench contact comprises forming the deep trenches using a first hard mask layer by means of an anisotropic etching method in the semiconductor substrate.

15. The method according to claim 1, wherein forming a side wall insulation layer at the side walls of the trenches comprises carrying out a thermal oxidation in order to form a trench insulation layer and carrying out an anisotropic etching method in order to remove a bottom region of the trench insulation layer.

16. The method according to claim 1, wherein forming an electrically conductive filling layer in the trenches, the electrically conductive filling layer being electrically connected to the at least one predetermined doping region of the semiconductor substrate, comprises depositing a highly doped semiconductor material having the same conduction type as the predetermined doping region.

17. The method according to claim 1, wherein removing at least the electrically conductive filling layer and side wall insulation layer in the upper region of the trenches for the trench isolation for the purpose of forming shallow trench isolations, comprises removing the conductive filling layer, the side wall insulation layer and adjoining regions of the semiconductor substrate in the upper region of the deep trenches in order to realize a widened trench isolation.

18. The method according to claim 1, wherein removing at least the electrically conductive filling layer and side wall insulation layer in the upper region of the trenches for the trench isolation for the purpose of forming shallow trench isolations, comprises removing only the conductive filling layer with or without the side wall insulation layer in the upper region of the trenches in order to realize a narrow trench isolation.

19. The method according to claim 1, wherein forming a covering insulation layer in the shallow trench isolations of the trench isolation comprises carrying out an oxidation in order to form a first covering insulation partial layer and/or carrying out a deposition in order to form a second covering insulation partial layer in the shallow trench isolation.

20. The method according to claim 1, wherein removing at least the electrically conductive filling layer and side wall insulation layer in the upper region of the trenches for the trench isolation comprises removing at least the electrically conductive filling layer and side wall insulation layer in the upper region of the trenches for the purpose of forming shallow trench isolations, the shallow trench isolations having a cross-section that is wider than a cross-section of the electrically conductive filling layer.

21. A method for fabricating a semiconductor component with trench isolation, the method comprising:
preparing a semiconductor substrate with at least one predetermined doping region;
forming deep trenches as far as the predetermined doping region for the purpose of realizing at least one trench isolation and a trench contact;
forming a side wall insulation layer at the side walls of the trenches;
forming an electrically conductive filling layer having the same conduction type as the predetermined doping region in the trenches, the electrically conductive filling layer being electrically connected to the at least one predetermined doping region of the semiconductor substrate;
removing at least the electrically conductive filling layer in the upper region of the trenches for the purpose of forming shallow trench isolations, the shallow trench isolations having a cross-section that is wider than a cross-section of the electrically conductive filing layer; and
forming a covering insulation layer in the shallow trench isolations of the trench isolation.

* * * * *

UNITED STATES PATENT AND TRADEMARK OFFICE
CERTIFICATE OF CORRECTION

Page 1 of 1

PATENT NO. : 8,691,660 B2
APPLICATION NO. : 12/883023
DATED : April 8, 2014
INVENTOR(S) : Franz Schuler and Georg Tempel It is certified that error appears in the above-identified patent and that said Letters Patent is hereby corrected as shown below:

On the Title Page, Item (54) and in the Specification, Column 1, line 2, Title, delete "TRENCH ISOLATION AND" and write "TRENCH INSULATION AND" in place thereof.

In the Claims

Column 8, line 58, delete "conductive filing layer" and write "conductive filling layer" in place thereof.

Column 10, line 60, delete "conductive filing layer" and write "conductive filling layer" in place thereof.

Signed and Sealed this
Third Day of February, 2015

Michelle K. Lee
*Deputy Director of the United States Patent and Trademark Office*